United States Patent [19]

Ellion et al.

[11] Patent Number: 4,692,559
[45] Date of Patent: Sep. 8, 1987

[54] THIN GAAS SOLAR CELL STRUCTURES

[75] Inventors: M. Edmund Ellion, Arcadia; George Wolff, Huntington Beach, both of Calif.

[73] Assignee: Hughes Aircraft Company, Los Angeles, Calif.

[21] Appl. No.: 918,585

[22] Filed: Oct. 9, 1986

Related U.S. Application Data

[62] Division of Ser. No. 773,910, Sep. 9, 1985, abandoned.

[51] Int. Cl.$^4$ ............................................. H01L 31/06
[52] U.S. Cl. ...................................... 136/262; 357/30
[58] Field of Search .................... 136/256, 262; 357/30

[56] References Cited

U.S. PATENT DOCUMENTS 4,227,941 10/1980 Bozler et al. ......................... 136/255
4,255,208 3/1981 Deutscher et al. .................. 148/175

OTHER PUBLICATIONS

Proceedings of the 15th IEEE Photovoltaic Specialists Conference, 12-15, May 1981, Kissimmee, Florida (US) J. C. C. Fan et al, "Thin Film GaAs Solar Cells", pp. 666-672.
JEE, Journal of Electronic Engineering, vol. 19, No. 186, Jun. 1982 (Tokyo, JP) Y. Yukimoto: "Research Advances for GaAs Solar Cells", pp. 39-42.
NASA Tech Briefs, Summer 1980, p. 135.

J. C. C. Fan et al, Conf. Record, 15th IEEE Photovoltaic Specialists Conf. (1981), pp. 666-672.
C. O. Bozler et al, Appl. Phys. Lett., vol. 31, pp. 629-631 (1977).
A. M. Barnett et al, Conf. Record, 17th IEEE Photovoltaic Specialists Conf. (1984), pp. 50-55.

Primary Examiner—Aaron Weisstuch
Attorney, Agent, or Firm—Steven M. Mitchell; Mark J. Meltzer; A. W. Karambelas

[57] ABSTRACT

A process for fabricating layered semiconductor structures, particularly thin gallium arsenide solar cells, on reusable substrates. The structure is fabricated by depositing a selectively removable layer such as gallium aluminum arsenide onto a substrate, and then depositing a solar cell basic structure on the selectively removable layer. Preferably, the solar cell basic structure includes a layer of p-type gallium arsenide on the layer of gallium aluminum arsenide; a layer of n-type gallium arsenide on the p-type gallium arsenide, and a transparent glass cover over the n-type gallium arsenide layer. The solar cell basic structure is separated from the substrate by selectively dissolving the gallium aluminum arsenide layer, and a new layer of gallium aluminum arsenide is epitaxially deposited upon the exposed face to form a thin, lightweight gallium arsenide solar cell. If the layer of p-type gallium arsenide is about 0.5 microns thick or less, the new layer of gallium aluminum arsenide may be omitted. The separated substrate can then be reused.

2 Claims, 3 Drawing Figures

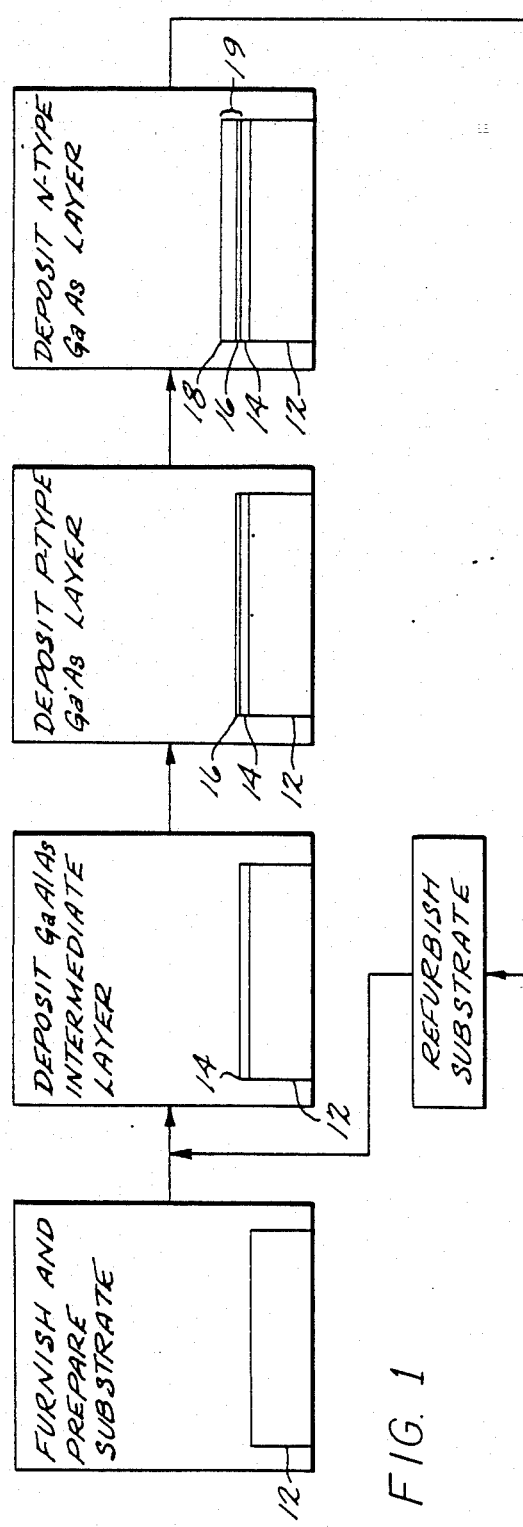

THIN GAAS SOLAR CELL STRUCTURES

This is a division of application Ser. No. 773,910, filed Sept. 9, 1985, now abandoned.

BACKGROUND OF THE INVENTION

This invention relates to the fabrication of layered semiconductor structures, and, more particularly, to the fabrication of thin, lightweight solar cells.

Semiconductor solar cells are utilized to convert light energy to usable electrical voltages and currents. Briefly, a typical semiconductor solar cell includes an interface between n-type and p-type transparent semiconductor materials. Light shining on the interface creates hole-electron pairs in addition to those otherwise present, and the minority charge carriers migrate across the interface in opposite directions. There is no compensating flow of majority carriers, so that a net flow of electrical charge results. A useful electrical current is then obtained in an external electrical circuit by forming ohmic contacts to the materials on either side of the interface.

Semiconductor solar cells may be produced from a wide variety of semiconductor materials. Silicon cells are most widely used, but it has been found that cells fabricated from p-type and n-type gallium arsenide are particularly promising. Such solar cells have higher beginning-of-life efficiency and lower degradation with time and temperature in a space environment, as compared with silicon solar cells. Gallium arsenide solar cells are therefore particularly attractive, and have already found limited use. It is expected that gallium arsenide solar cells will find increased future application, in both space and on earth, if their cost of manufacture and weight per unit area of solar cell can be reduced.

A gallium arsenide solar cell is fabricated by depositing the appropriate semiconductor layers onto a substrate, and then adding additional components to complete the cell. More specifically, a conventional P-on-N gallium arsenide solar cell is fabricated by epitaxially depositing a layer of n-type gallium arsenide onto a single crystal gallium arsenide substrate, and depositing a layer of p-type gallium arsenide over the layer of n-type gallium arsenide. A P+ layer of gallium aluminum arsenide is deposited over the layer of p-type gallium arsenide to limit surface recombination of charge carriers. A transparent cover of glass is applied over the gallium aluminum arsenide layer to protect the active semiconductor components from physical contact and radiation damage such as encountered in a space environment. Electrical contacts to the n-type and p-type layers are applied at a convenient point.

The resulting solar cell retains the gallium arsenide substrate in contact with the remaining portions of the solar cell, but the substrate performs no essential function during operation of the solar cell and adds weight. Moreover, retention of the substrate on the solar cell requires the use of a new, separate substrate for preparing each solar cell, adding significantly to the cost of preparing the solar cell because the substrate must be grown as a single crystal and then further polished and prepared for epitaxial deposition. Thus, it would be highly desirable to be able to separate the active components of the basic solar cell from the substrate, both to reduce the weight of the solar cell and to allow the substrate to be reused in preparing subsequent solar cells.

Several approaches have been suggested for process modifications whereby the active portions of the solar cell could be separated from the substrate during fabrication. In one approach, the edges of the cell are masked and the substrate is dissolved away. Such a procedure achieves weight reduction but is difficult to control, and, of course, does not allow reuse of the substrate. In another approach, it has been suggested that an intermediate layer of gallium aluminum arsenide be epitaxially deposited between the substrate and the layer of n-type gallium arsenide. The remaining active semiconductor elements are fabricated on top of this layer, as previously described, including the top layer of p+ gallium aluminum arsenide. The active elements of the solar cell are masked, leaving the intermediate layer of gallium aluminum arsenide exposed. This layer is then dissolved away to separate the active elements of the basic solar cell from the substrate. This technique has been successfully used, but is difficult to apply to mass production of solar cells because the two layers of gallium aluminum arsenide are separated by only about 50 micrometers, so that masking of the layer in contact with the p-type gallium arsenide layer is difficult. In a variation of this technqiue, access holes have been drilled upwardly through the substrate to contact the intermediate layer of gallium aluminum arsenide. A selective reagent which attacks only gallium aluminum arsenide is then contacted to the intermediate layer through the access holes, to dissolve away the intermediate layer of gallium aluminum arsenide. This procedure is very slow, as the dissolved material and fresh selective reagent must be diffused along the long, narrow access holes. Moreover, the presence of the access holes makes the substrate essentially unusable for further fabrication operations, since it is difficult to achieve subsequent epitaxial deposition over the areas where the access holes penetrate the surface of the substrate.

There therefore exists a need for a technique where the active semiconductor elements of a basic solar cell may be effectively separated from the substrate upon which the elements are deposited during fabrication. The resulting solar cell would be thin and light in weight as a result of removal of the substrate. Preferably, the technique would not dissolve or otherwise significantly damage the substrate, so that the expensive substrate would be reused successively to manufacture further solar cells. The fabrication process would also allow retention and use of the transparent glass cover, so that the solar cell would be protected and could be manipulated readily by handling the glass cover. The present invention fulfills this need, and further provides related advantages.

SUMMARY OF THE INVENTION

The present invention resides in a process for fabricating thin, lightweight layered semiconductor stuctures such as solar cells, wherein the substrate used to fabricate the solar cells is separated from the active elements of the solar cell. The resulting solar cell structure is reduced in weight by the weight of the substrate. The substrate is substantially undamaged so that it may be later reused as a substrate for growth of other solar cells, thereby substantially reducing the solar cell fabrication costs. The resulting solar cell itself has a structure modified somewhat from that of conventional solar cells, but the structural modifications do not result in substantially reduced operating performance. Moreover, desirable features of conventional solar cells are retained, including a protective transparent glass cover and a p+ layer inhibiting recombination at the surface of the p-type semiconductor layer, if necessary.

In accordance with the invention, a process for fabricating a layered semiconductor structure having multiple elements comprises the steps of providing a substrate; depositing a selectively removable layer on the substrate; depositing a layered semiconductor basic structure having multiple elements on the selectively removable layer; and removing the selectively removable layer by a selective process having no side mask, thereby separating the layered semiconductor basic structure from the substrate without removing any element of the semiconductor structure, whereby an exposed face of the layered semiconductor basic structure is created. A further layer may then be deposited on the exposed face, if desired. Removal of the selectively removable layer may be accomplished by any appropriate technique, but dissolution by a selective liquid reagent is preferred.

More specifically, a preferred process for fabricating a solar cell structure comprises the steps of providing a single crystal substrate; depositing a selectively removable layer epitaxially on the substrate; depositing an active semiconductor solar cell on the selectively removable layer, the solar cell including a p-type layer adjacent the selectively removable layer and an n-type layer remote from the selectively removable layer; attaching a transparent cover to the top of the semiconductor solar cell, thereby forming a solar cell basic structure joined to the substrate by the selectively removable layer; and removing the selectively removable layer to separate the solar cell basic structure from the substrate. An inhibitory layer may then be deposited on the exposed face of the solar cell basic structure to inhibit surface charge recombination. If the thickness of the layer of p-type gallium arsenide is not greater than about 0.5 micrometers, no inhibiting layer is required. The solar cells of the invention may be fabricated using any appropriate combination of materials, but preferably the substrate is gallium arsenide, the selectively removable layer is gallium aluminum arsenide, and the cover is glass.

In a most preferred embodiment, a process for fabricating a thin solar cell structure comprises the steps of providing a single crystal gallium arsenide substrate; depositing an intermediate layer of gallium aluminum arsenide epitaxially on the substrate; depositing a layer of p-type gallium arsenide epitaxially on the layer of gallium aluminum arsenide; depositing a layer of n-type gallium arsenide epitaxially on the layer of p-type gallium arsenide; attaching a glass cover over the layer of n-type gallium arsenide, thereby forming a solar cell basic structure joined to the substrate by the intermediate layer of gallium aluminum arsenide; and contacting the solar cell basic structure joined to the substrate to a selective liquid reagent which selectively dissolves the intermediate layer of gallium aluminum arsenide, thereby separating the solar cell basic structure from the substrate and leaving an exposed face on the solar cell basic structure. If the thickness of the layer of p-type gallium arsenide is greater than about 0.5 micrometers, a charge recombination inhibitory layer of gallium aluminum arsenide is deposited epitaxially on the exposed face. If the layer of p-type gallium arsenide is not greater than about 0.5 micrometers, i.e. less than or equal to about 0.5 micrometers, then it is not necessary to add a charge recombination inhibitory layer. In this preferred process, the selective liquid reagent is a mixture of hydrogen peroxide and ammonium hydroxide, which attacks gallium aluminum arsenide but is substantially non-reactive with gallium arsenide and doped gallium arsenide.

In accordance with another aspect of the invention, a solar cell comprises a layer of p-type gallium arsenide having a thickness of not greater than about 0.5 micrometers; a layer of n-type gallium arsenide, the layer of p-type gallium of n-type gallium arsenide together constituting an active semiconductor solar cell; and a glass cover in contact with the active semiconductor solar cell, the solar cell having no charge recombination inhibitory layer in contact with the layer of p-type gallium arsenide. Preferably, the glass cover contacts the layer of n-type gallium arsenide.

It will be appreciated that the present invention provides an important advance in the field of fabrication of thin semiconductor structures, particularly thin, lightweight solar cells. The expensive substrate is recovered for subsequent reuse, thereby reducing process costs. The weight of the solar cell is also reduced by separation of the substrate, reducing the cost of transporting the solar cell to orbit and the cost of structure required to support the solar cell in a gravitational environment. The resulting solar cell is of an N on P configuration rather than the conventional P on N configuration. This configurational change results in slightly decreased solar cell efficiency, but the change is extremely small and of no practical consequence. The fabrication procedure allows retention of the glass transparent cover and use of a recombination inhibitory layer, if necessary, as in conventional gallium arsenide solar cells. The resulting solar cell is therefore substantially identical in performance with conventional solar cells, while having significantly reduced cost and weight. Other features and advantages of the present invention will become apparent from the following more detailed description taken in conjunction with the accompanying drawings, which illustrate, by way of example, the principles of the invention.

BRIEF DESCRIPTION OF THE DRAWINGS

FIG. 1 is a schematic process flow chart for preparing a solar cell, illustrating the structure obtained in each process step; and FIG. 2 is a side sectional view of a solar cell produced by the process illustrated in FIG. 1.

FIG. 3 is a side sectional view of a solar cell produced by the process illustrated in FIG. 1, except that the p-type gallium arsenide layer is thinner, and no inhibitory layer is deposited.

DETAILED DESCRIPTION OF THE PREFERRED EMBODIMENT

In accordance with a preferred embodiment of the invention, a thin, lightweight gallium arsenide solar cell 10 as shown in FIG. 2 is fabricated by the process schematically illustrated in FIG. 1. The solar cell is fabricated on a gallium arsenide single crystal substrate 12, which may be prepared by any of several well established techniques. Most commonly, a gallium arsenide single crystal is prepared by the horizontal Bridgeman technique. Substrates suitable for use in the preparation of solar cells are prepared by slicing wafers about 200 micrometers thick from the solidified single crystal. The surface orientation of the wafers is typically selected to be about (100) (cubic Miller indices notation). Gross damage induced during the slicing procedure is removed by polishing the wafer on successively finer grits of metallographic polishing paper, finishing with 4/0 diamond paste. The polished wafer is then etched in a solution of hydrogen peroxide and ammonium hydroxide to remove any residual polishing damage.

An intermediate layer 14 of gallium aluminum arsenide is epitaxially deposited on the prepared face of the substrate 12. The composition of the gallium aluminum arsenide is chosen so that the layer 14 is selectively dissolvable by a selective liquid reagent, preferably a mixture of hydrogen peroxide and ammonium hydroxide. Hydrochloric acid or hydrofluoric acid may also be used as selective liquid reagents. The selective liquid reagent does not substantially attack or dissolve any other element of the solar cell, so that at a later processing stage the gallium aluminum arsenide intermediate layer 14 may be dissolved to separate the substrate 12. The thickness of the layer 14 of gallium aluminum arsenide is not critical, but should be sufficiently large to allow penetration of the selective liquid reagent and diffusion outwardly of the reaction products of the dissolution process. Preferably, the gallium aluminum arsenide has a composition of about $Ga_{0.7}Al_{0.3}As$ and a thickness of about 10 micrometers. The electrical characteristics of the gallium aluminum arsenide layer 14 are not significant, inasmuch as the layer 14 is eventually removed by the dissolution.

Although the preferred material for the layer 14 is gallium aluminum arsenide, other preferentially dissolvable materials may be utilized. Gallium aluminum arsenide is preferred, inasmuch as it may be epitaxially deposited on the substrate 12, and may have doped gallium arsenic layers epitaxially deposited upon it. Selective liquid reagent procedures for dissolving gallium aluminum arsenide from gallium arsenide are well established.

A layer 16 of p-type gallium arsenide is epitaxially deposited on the layer 14 of gallium aluminum arsenide. The electrical characteristics and thickness of the layer 16 are chosen to provide optimal performance of the solar cell 10. Preferably, the p-type gallium arsenide in the layer 16 has a net charge carrier concentration of about $10^{18}$ per cubic centimeter, with a thickness of about 0.5 micrometers or less.

A layer 18 of n-type gallium arsenide is deposited on top of the layer 16 of p-type gallium arsenide. The electrical characteristics and thickness of the layer 18 are chosen to optimize performance of the solar cell. The n-type gallium arsenide of the layer 18 preferably has a net charge carrier concentration of about $10^{18}$ per cubic centimeter and a thickness of about 10 micrometers. The active elements of the semiconductor solar cell 10, herein the n-type layer 18 and the p-type layer 16, are collectively termed an active semiconductor solar cell 19.

The layers 14, 16, and 18 are deposited by techniques well known in the art, preferably liquid phase epitaxial growth or vapor phase metal oxide chemical vapor deposition. The liquid phase epitaxial growth of gallium arsenide solar cells is accomplished by dipping substrates of gallium arsenide into a gallium melt saturated with gallium arsenide. This process is performed with the melt at 750° C. in a sealed, nitrogen purged system. Vapor phase metal oxide chemical vapor deposition takes place when tri-metal gallium in a gaseous form mixes with arsine gas. The mixture decomposes into gallium arsenide and is deposited on a gallium arsenide substrate at 750° C. in a low pressure chamber.

A transparent cover 20 is attached to the upper surface of the layer 18. The composition and thickness of the transparent cover 20 are selected to optimize the electrical performance of the solar cell 10. Preferably, the transparent cover 20 is a silica glass such as Corning Glass type 7940, having a thickness of about 200 micrometers. The transparent cover 20 performs three important functions. First, the cover 20 allows light to pass through to the layers 16 and 18. Second, the cover 20 supports the remaining elements of the solar cell 10. Third, the cover 20 protects the remaining elements from physical damage and radiation in a space environment.

The transparent cover 20 may be bonded to the layer 18 by any suitable technique, such as by a transparent adhesive or electrostatic bonding. It is preferred that the bonding technique permit retention of the bond at temperatures as high as about 200° C., to resist delamination in subsequent processing and in use. High temperature adhesives of high molecular weight compounds such as carborane siloxane polymer have been found to be operable.

The p-type gallium arsenide layer 16, the n-type gallium arsenide layer 18, and the transparent cover 20 are collectively termed a solar cell basic structure 22. The basic structure 22 is joined to the substrate 12 by the layer 14 of gallium aluminum arsenide, at this point in the fabrication procedure. This structure effectively operates as a solar cell, when external electrical contacts to the layers 16 and 18 are provided. However, the substrate 12 performs no essential function in such a solar cell, and in later steps is removed intact for subsequent reuse.

The substrate 12 is removed by contacting the joined basic structure 22, layer 14, and substrate 12 to a selective liquid reagent which selectively dissolves the gallium aluminum arsenide layer 14, thereby separating the solar cell basic structure 22 from the substrate 12. The preferred selective liquid reagent for use with gallium arsenide technology is a mixture of hydrogen peroxide and ammonium hydroxide having a pH greater than 7. Hydrogen chloride acid or hydrogen fluoride acid may also be used. The time required to accomplish the selective dissolution varies with the lateral dimensions of the solar cell 10. That is, the larger the solar cell 10 in lateral dimension, the greater the time required for the liquid reagent to penetrate the layer 14 to achieve complete disolution across the entire area of the solar cell 10. As an example, complete selective dissolution of the layer 14 is achieved in a 10 centimeter diameter solar cell 10 in a period of 2 hours. Upon completion of the dissolution, the basic structure 22 separates from the substrate 12, and the substrate 12 may be removed for subsequent refurnishment and reuse. The substrate 12 is washed and dried to remove traces of the selective liquid reagent, and may be repolished and re-etched in the manner described previously if inspection of the surface reveals any damage.

The described process does not require that a side mask be applied to prevent dissolution of a portion of the basic structure 22. In prior P-on-N solar cell structures, it was necessary to have two layers of gallium aluminum arsenide in place simultaneously, and exposure to a dissolving solution would have attacked both such layers. The basic structure 22 would thereby have been damaged. The alternative would have been to attempt to apply a mask on the side of the structure to prevent the second layer from being attacked. However, it is difficult to apply such a side mask accurately due to the small thickness dimensions of the layers of the solar cell 10. Here, the use of an N-on-P configuration allows a charge recombination inhibitory layer of gallium aluminum arsenide to be deposited (as next described) after the intermediate layer 14 is removed. Thus, no side mask is necessary in the process.

Separation of the basic structure 22 from the substrate 12 leaves a basic structure exposed face 24, which is the bottom side of the p-type gallium arsenide layer 16. Operation of the basic structure 22 might be adversely affected by surface charge recombination, at the exposed face 24, unless charge recombination is inhibited, as by the following technique. To prevent surface recombination, a p+ gallium aluminum arsenide inhibitory layer 26 is deposited onto the exposed face 24 of the base structure 22. The p+ gallium aluminum arsenide layer 26 is preferably of net charge carrier concentration of about $2 \times 10^{18}$ per cubic centimeter, with a thickness of about 0.1 micrometers. These values of charge concentration and thickness are chosen to optimize the performance of the solar cell.

In another embodiment, the p-type gallium arsenide layer of an active semiconductor solar cell may be deposited as a very thin layer, no greater than about 0.5 micrometers. It has been found that, when the p-type layer is about 0.5 or less, no surface recombination layer is necessary. In the embodiment illustrated in FIG. 3, which is otherwise similar to that shown in FIG. 2, the p-type gallium arsenide layer 16 is about 0.5 micrometers or less in thickness, and it has been found unnecessary to add an inhibitory layer 26. This approach is also applicable to conventional P-on-N solar cells, where an inhibitory layer need not be added to the surface of the p-type gallium arsenide layer, if the p-type layer os 0.5 micrometers or less in thickness.

Each of the resulting structures is termed a "thin" solar cell 10. As used herein, the term "thin" is a term of art used to denote a solar cell having reduced thickness due to the removal of the substrate 12, thereby distinguishing conventional solar cells wherein the substrate is retained. The term "thin" is not meant to limit the thickness to any particular numerical value.

The thin solar cell 10 may be manipulated and handled by grasping the transparent cover 20. Conventional ohmic contacts such as silver alloy may be independently applied to the layers 16 and 18 to provide external contact for production of a voltage and current flow, at any appropriate stage of the fabrication procedure.

It will be noted that the solar cell 10 prepared by the present fabrication technique is of an N-on-P configuration, inasmuch as the light passing through the transparent cover 20 first encounters the n-type gallium arsenide layer 18. By contrast, conventional gallium arsenide solar cells are of a P-on-N configuration, wherein light pasing through the transparent cover 20 first encounters a p-type layer. The electrical operating characteristics of a P-on-N solar cell are very slightly superior to those of the N-on-P solar cell of the present invention, but in most applications the improvement in electrical output per unit weight of solar cell, resulting in the N-on-P solar cell, makes this configuration preferred. That is, the ability to economically remove and reuse the substrate 12 from the N-on-P solar cell, and its reduced weight, make the N-on-P solar cell preferable to the P-on-N solar cell.

The cost and weight advantages of the solar cell produced by the fabrication technique of the present invention may be estimated, based upon current fabrication costs and dimensions. It is estimated that the cost of fabricating a solar cell of specified dimensions is reduced by about 30 percent through the use of the present invention, inasmuch as the expensive substrate 12 may be reused with minimal refurbishment costs. It is also estimated that the weight of the solar cell of the present invention is reduced significantly as compared with solar cells wherein the substrate is not removed. In terms of weight, a conventional large solar panel having dimensions of about 3 meters $\times$ 3 meters and containing 10,600 gallium arsenide solar cells, each of dimension 2 cm $\times$ 4 cm, with an electrical output of 54 amps at 28 volts, weighs about 50 kilograms when conventional gallium arsenide solar cells are used. The weight of the panel is reduced by about 11 kilograms when the present fabrication technqiue is used. This weight saving is highly significant in transportation costs, when the solar panel is to be transported to earth orbit.

The fabrication procedure of the present invention produces a solar cell having significant cost and weight advantages over prior conventional solar cells. The N-on-P solar cell of the present invention has a physical configuration and performance generally similar to that of the conventional P-on-N solar cell, so that the transparent cover 20 may be used to support and protect the solar cell, and so that the p+ inhibitory layer can be used to inhibit surface charge recombination on the p-type gallium arsenide layer. The cost of producing the N-on-P solar cell is significantly reduced, an important consideration in mass production of solar cells for use in space and on earth. The reduced weight of the solar cell also reduces the cost of placing large solar arrays into orbit. Although a particular embodiment of the invention has been described in detail for purposes of illustration, various modifications may be made without departing from the spirit and scope of the invention. Accordingly, the invention is not to be limited except as by the appended claims.

What is claimed is:

1. A solar cell, comprising:
    a layer of p-type gallium arsenide haviang a thickness of not greater than about 0.5 micrometers;
    a layer of n-type gallium arsenide, said layer of p-type gallium arsenide and the layer of n-type gallium arsenide together constituting an active semiconductor solar cell;
    a glass cover in contact with said active semiconductor solar cell, said solar cell having no charge recombination inhibitory layer in contact with said layer of p-type gallium arsenide.

2. The solar cell of claim 1, wherein said glass cover contacts said layer of n-type gallium arsenide.

* * * * *